United States Patent
Shen et al.

(10) Patent No.: US 8,640,011 B2
(45) Date of Patent: *Jan. 28, 2014

(54) SINGLE CRC POLYNOMIAL FOR BOTH TURBO CODE BLOCK CRC AND TRANSPORT BLOCK CRC

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/559,788

(22) Filed: Jul. 27, 2012

(65) Prior Publication Data

US 2012/0311400 A1    Dec. 6, 2012

Related U.S. Application Data

(63) Continuation of application No. 12/261,572, filed on Oct. 30, 2008, now Pat. No. 8,234,551.

(60) Provisional application No. 60/985,125, filed on Nov. 2, 2007.

(51) Int. Cl.
*H03M 13/11*    (2006.01)

(52) U.S. Cl.
USPC ......................................................... 714/781

(58) Field of Classification Search
None
See application file for complete search history.

(56) References Cited

U.S. PATENT DOCUMENTS

| | | | |
|---|---|---|---|
| 6,606,727 B1 * | 8/2003 | Yang et al. | 714/774 |
| 2005/0172201 A1 * | 8/2005 | Kutz et al. | 714/755 |
| 2005/0190868 A1 * | 9/2005 | Khandekar et al. | 375/346 |
| 2007/0168841 A1 * | 7/2007 | Lakkis | 714/781 |
| 2008/0320353 A1 * | 12/2008 | Blankenship et al. | 714/746 |
| 2009/0077447 A1 * | 3/2009 | Buckley et al. | 714/757 |
| 2009/0083606 A1 * | 3/2009 | Choi et al. | 714/776 |
| 2010/0205518 A1 * | 8/2010 | Golitschek Edler von Elbwart et al. | 714/807 |

* cited by examiner

*Primary Examiner* — Gabriel Chu

(74) *Attorney, Agent, or Firm* — Garlick & Markison; Shayne X. Short

(57) ABSTRACT

Single CRC polynomial for both turbo code block CRC and transport block CRC. Rather than employing multiple and different generation polynomials for generating CRC fields for different levels within a coded signal, a single CRC polynomial is employed for the various levels. Effective error correction capability is achieved with minimal hardware requirement by using a single CRC polynomial for various layers of CRC encoding. Such CRC encoding can be implemented within any of a wide variety of communication devices that may be implemented within a wide variety of communication systems (e.g., a satellite communication system, a wireless communication system, a wired communication system, and a fiber-optic communication system, etc.). In addition, a single CRC check can be employed within a receiver (or transceiver) type communication device for each of the various layers of CRC of a received signal.

20 Claims, 15 Drawing Sheets

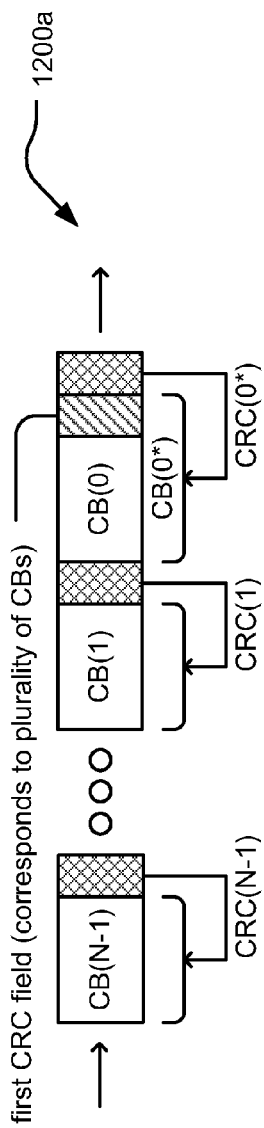
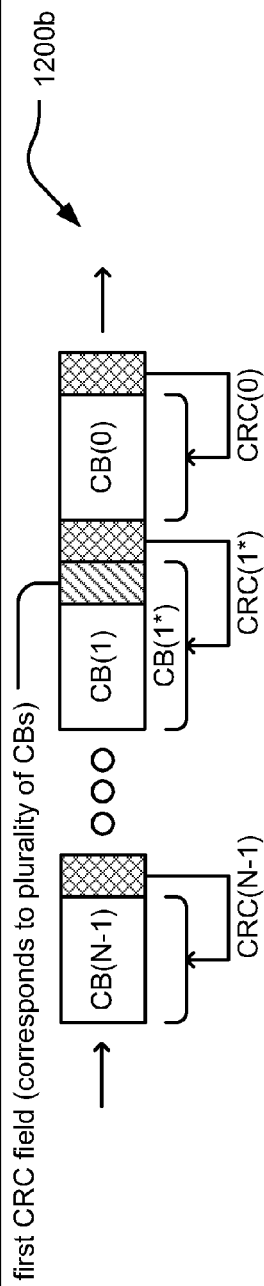
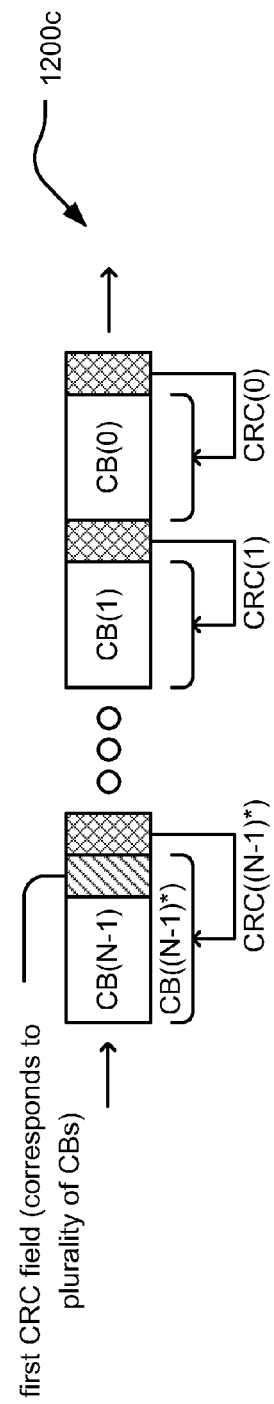
Fig. 12A
Fig. 12B
Fig. 12C

SINGLE CRC POLYNOMIAL FOR BOTH TURBO CODE BLOCK CRC AND TRANSPORT BLOCK CRC

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:
1. U.S. Utility patent application Ser. No. 12/261,572, entitled "Single CRC polynomial for both turbo code block CRC and transport block CRC,", filed Oct. 30, 2008, pending, and scheduled subsequently to be issued as U.S. Pat. No. 8,234,551 on Jul. 31, 2012 (as indicated in an ISSUE NOTIFICATION mailed from the United States Patent and Trademark Office (USPTO) on Jul. 11, 2012), which claims priority pursuant to 35 U.S.C. §119(e) to the following U.S. Provisional Patent Application which is hereby incorporated herein by reference in its entirety and made part of the present U.S. Utility patent application for all purposes:
   1.1. U.S. Provisional Application Ser. No. 60/985,125, entitled "Single CRC polynomial for both turbo code block CRC and transport block CRC,", filed Nov. 2, 2007, now expired.

BACKGROUND OF THE INVENTION

1. Technical Field of the Invention

The invention relates generally to communication systems; and, more particularly, it relates to performing cyclic redundancy check (CRC) encoding and/or decoding within such communication systems.

2. Description of Related Art

Data communication systems have been under continual development for many years. One such type of communication system that has been of significant interest lately is a communication system that employs iterative error correction codes. Of those, one particular type of communication system that has received much interest in recent years has been one which employs turbo codes (one type of iterative error correcting code). Other types of error correction codes are also existent in the art. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ coding, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF DESCRIPTION OF THE SEVERAL VIEWS OF THE DRAWINGS

FIG. 12A, FIG. 12B, and FIG. 12C illustrate embodiments of various manners by which multi-level CRC encoding maybe performed.

DETAILED DESCRIPTION OF THE INVENTION

A single polynomial is employed to perform two separate layers of cyclic redundancy check (CRC) encoding and/or decoding. Rather than dedicate and employ two separate generator polynomials for each of the two layers of the CRC encoding and/or decoding processing. This principle can be extended to even more than two layers of CRC (e.g., 3 layers or even more) without departing from the scope and spirit of the invention.

Two layered CRC (cyclic redundancy check), one for turbo code blocks (CB) and the other for transport block (TB) have been adopted in TS 36.212 (e.g., see reference [1]). Generally speaking, the prior art assumes that two separate and different CRC generator polynomials are needed to service the two separate layers of CRC. However, herein, it is shown that indeed a second polynomial is not necessary, i.e. one CRC polynomial is sufficient for two layers of CRC.

There are two possible ways to judge the effectiveness of a CRC system, namely:

1. Statistic method (related to a specific communication channel), which computes the probability of undetectable error based on the given communication channel. Due to the complexity of mobile radio communication channel (a wireless com channel), so far there is no clear way to use this method in a mobile communication channel.

2. Combinatorial method (not relate to channel), which computes the number of all possible error vectors that are undetectable by the CRC. Usually this method gives an upper bound of the probability of undetectable error.

Herein, the combinatorial method is employed.

The following two different two layers CRC systems are considered in this document, Equal-polynomial-system: Both CB and TB use the same CRC generator polynomial Unequal-polynomials-system: CB and TB use different CRC generator polynomial, respectively.

In reference [2], a special case of errors on TB after turbo decoding is considered, which satisfies the following three conditions:

a) Two CBs in one TB;
b) One CB is corrected by turbo decoder and the other CB contains undetectable error;
c) Error in TB is undetectable.

The first part of this disclosure contributes to this special case. The number of error vectors that satisfy a), b) and c) is calculated for both an Equal-polynomial-system and an Unequal-polynomial-system. It turns out that they are the same. In the second part of this disclosure, the same conclusion is proven in general, i.e. without the restrictions of a), b) and c). With this conclusion, it can clearly be seen that one CRC polynomial (i.e., one generation polynomial) is sufficient for multiple layers of CRC encoding (e.g., for both the CRC check employed for the individual CBs and also jointly for the TB CRC check as well in one embodiment).

Figure 1:
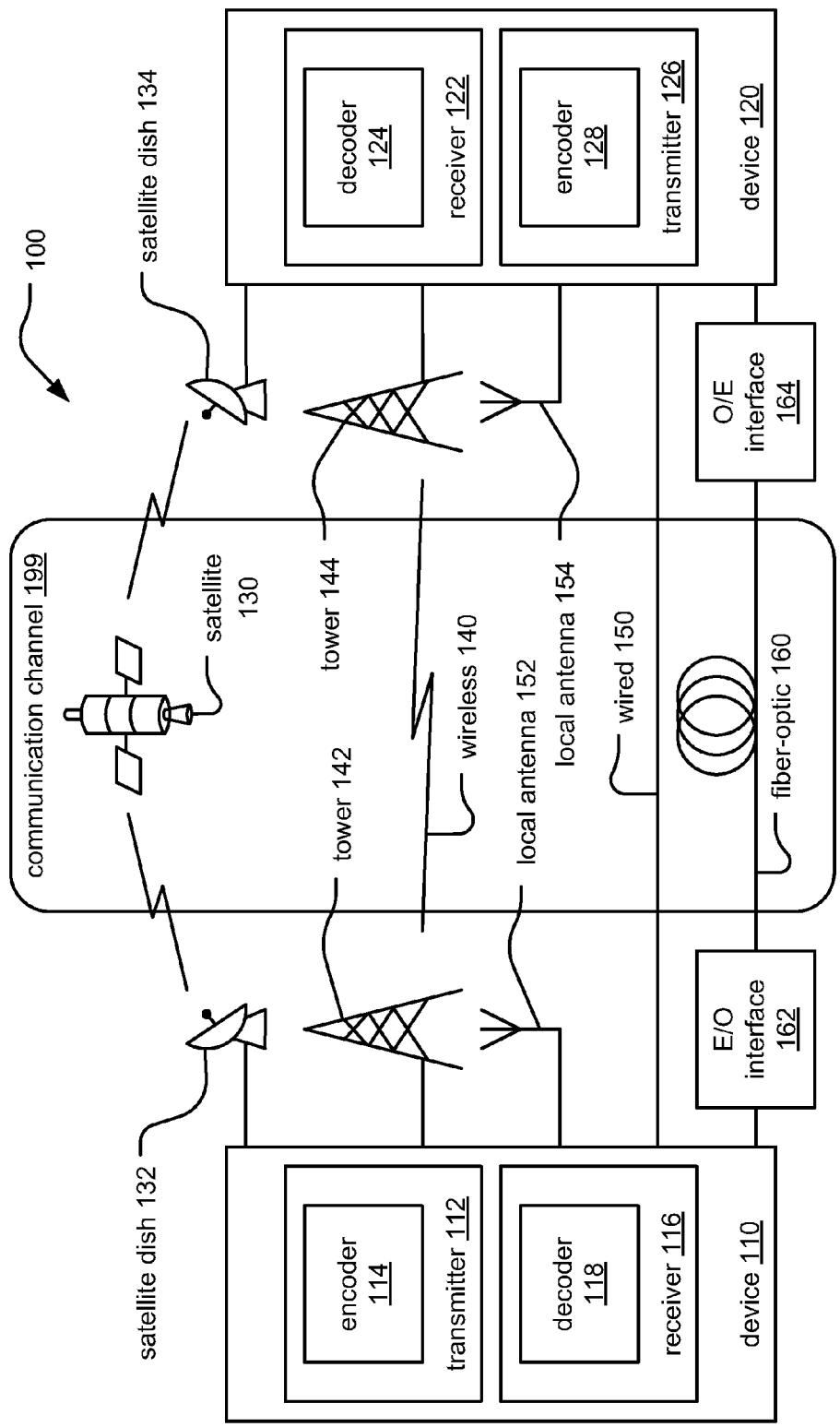
FIG. 1 and FIG. 2 illustrate various embodiments of communication systems.

Generally speaking, the goal of digital communications systems is to transmit digital data from one location, or sub-system, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
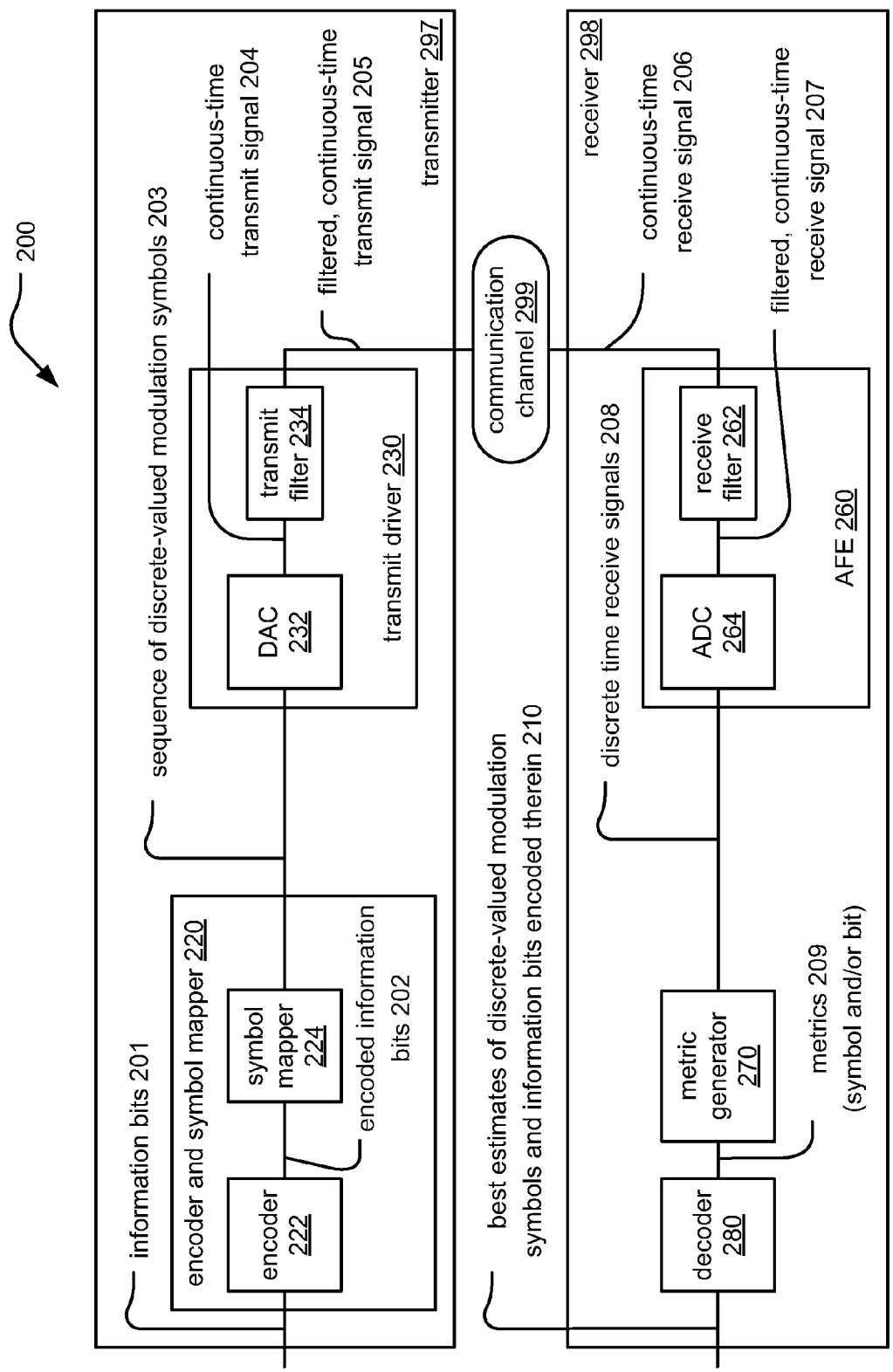

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 (e.g., a cellular communication system as one example) using towers 142 and 144 and/or local antennae 152 and 154, a wired communication channel 150 (e.g., an Ethernet communication system as one example), and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter side of the communication channel and a decoder at the receiver side of the communication channel. In some contexts (e.g., a hard disk drive (HDD) system in which information is written to and read from the storage media of the HDD), both the encoder and decoder can be situated on the same side of the read channel (which is that the communication channel coupling to the media is oftentimes referred as).

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The CRC encoding and functionality described herein can be performed and implemented within any of the encoding modules described herein including those depicted in the embodiments of FIG. 1 (e.g., encoder 114 and/or encoder 124) and FIG. 2 (e.g., encoder 222).

The encoder and decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

Various types of coded signals can be employed in this embodiment as well as within other embodiments as well, including uncoded signals, turbo encoded signals, turbo trellis coded modulation (TTCM) encoded signals, LDPC (Low Density Parity Check) encoded signals, and a RS (Reed-Solomon) encoded signals, among just some types of signals that can be employed in accordance with certain aspects of the invention.

Figure 3:
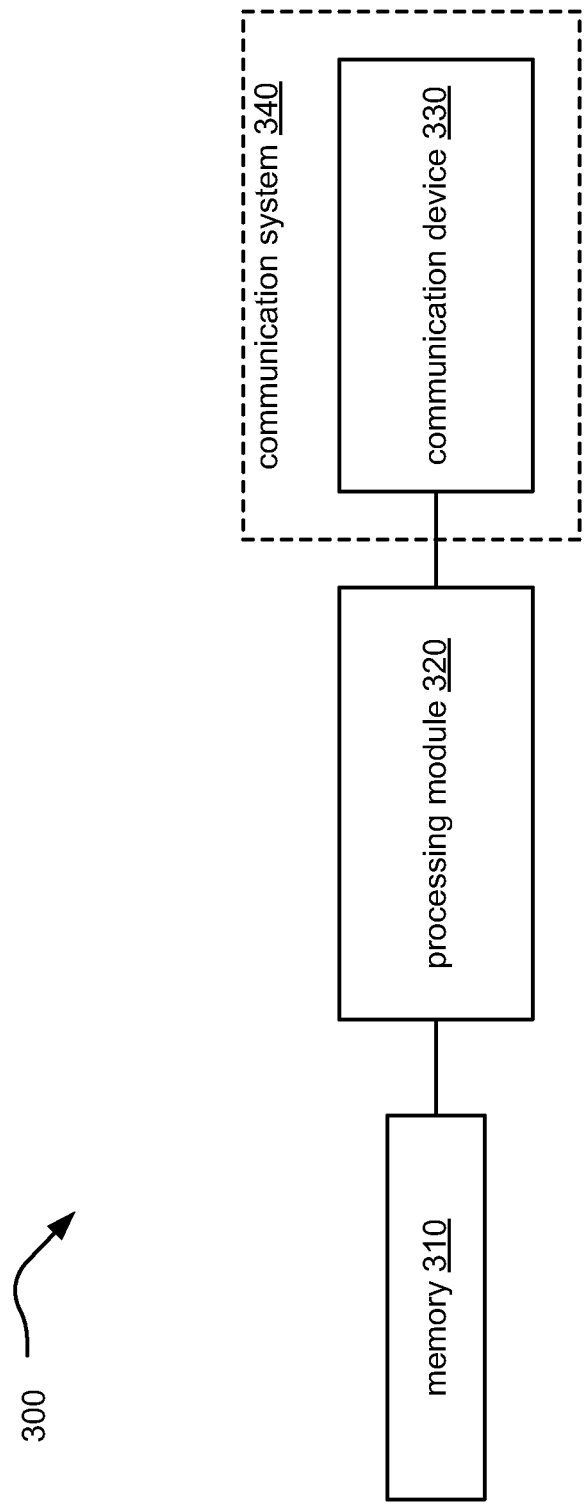
FIG. 3 illustrates an embodiment of an apparatus that is operable to be implemented within a communication system.

FIG. 3 illustrates an embodiment of an apparatus 300 that is operable to be implemented within a communication system. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which encoding and/or decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the encoding and/or decoding processing is to be performed can be provided from the apparatus 300 to a communication system 340 that is operable to employ and perform the particular type of cyclic redundancy check (CRC) encoding and/or decoding. For example, when considering one possible embodiment that employs a single polynomial for CRC encoding and/or decoding of both an entire transport block as well as each of the individual turbo code blocks that compose the transport block, information corresponding to the manner in which the CRC encoding and/or decoding processing is to be performed can also be provided from the processing module 320 to any of a variety of communication devices 330 implemented within the communication system 340 as well. In addition, similar information can also be provided from the processing module 320 to any of a variety of communication devices 330 implemented within the communication system 340 (e.g., within an embodiment that includes multiple communication devices).

If desired, the apparatus 320 can be designed to generate multiple means of performing encoding and/or decoding in accordance with multiple needs and/or desires as well. In some embodiments, the processing module 320 can selectively provide different information (e.g., corresponding to embodiments of CRC encoding and/or decoding, etc.) to different communication devices and/or communication systems. That way, different communication links between different communication devices can employ different codes and/or means by which to perform decoding. Clearly, the processing module 320 can also provide the same information to each of different communication devices and/or communication systems as well without departing from the scope and spirit of the invention.

Figure 4:
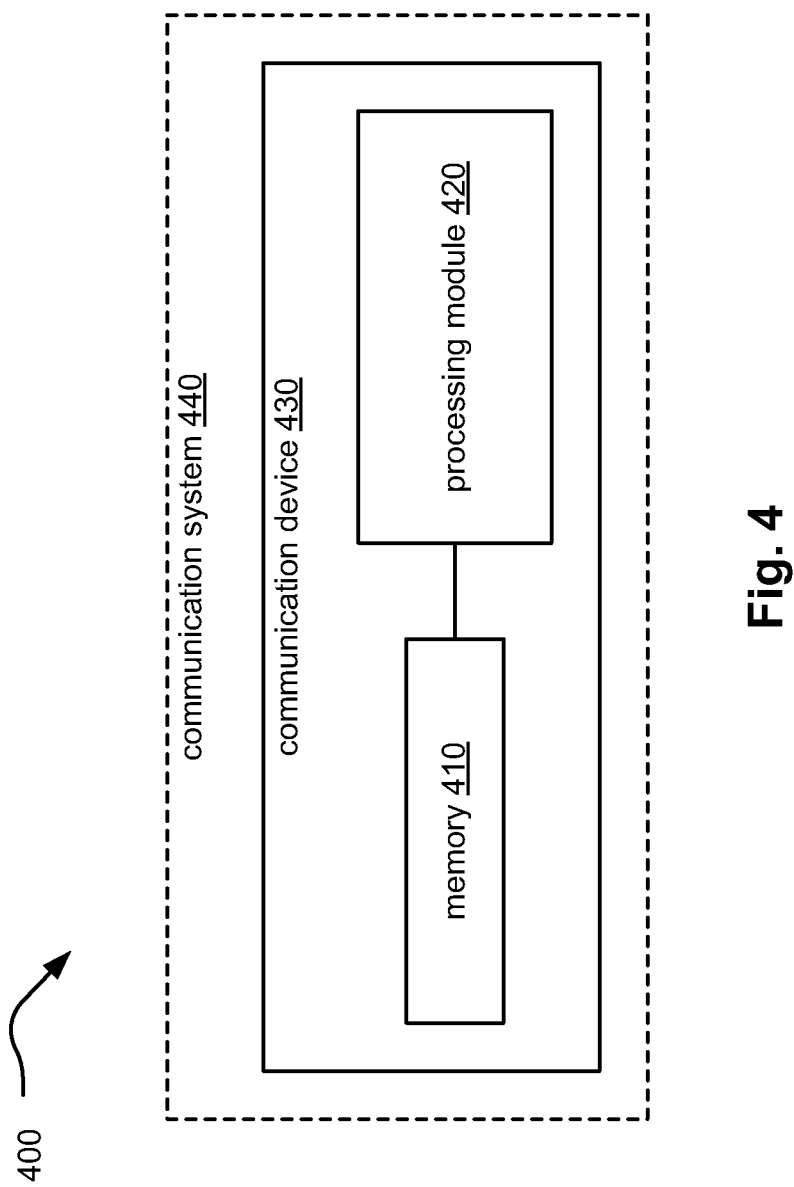
FIG. 4 illustrates an alternative embodiment of an apparatus that is operable to be implemented within a communication system.

FIG. 4 illustrates an alternative embodiment of an apparatus 400 that is operable to be implemented within a communication system. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which CRC encoding and/or decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of encoding and/or decoding processing such as those presented herein, and equivalents thereof, may be applied to many types of communication systems and/or communication devices.

Figure 5:
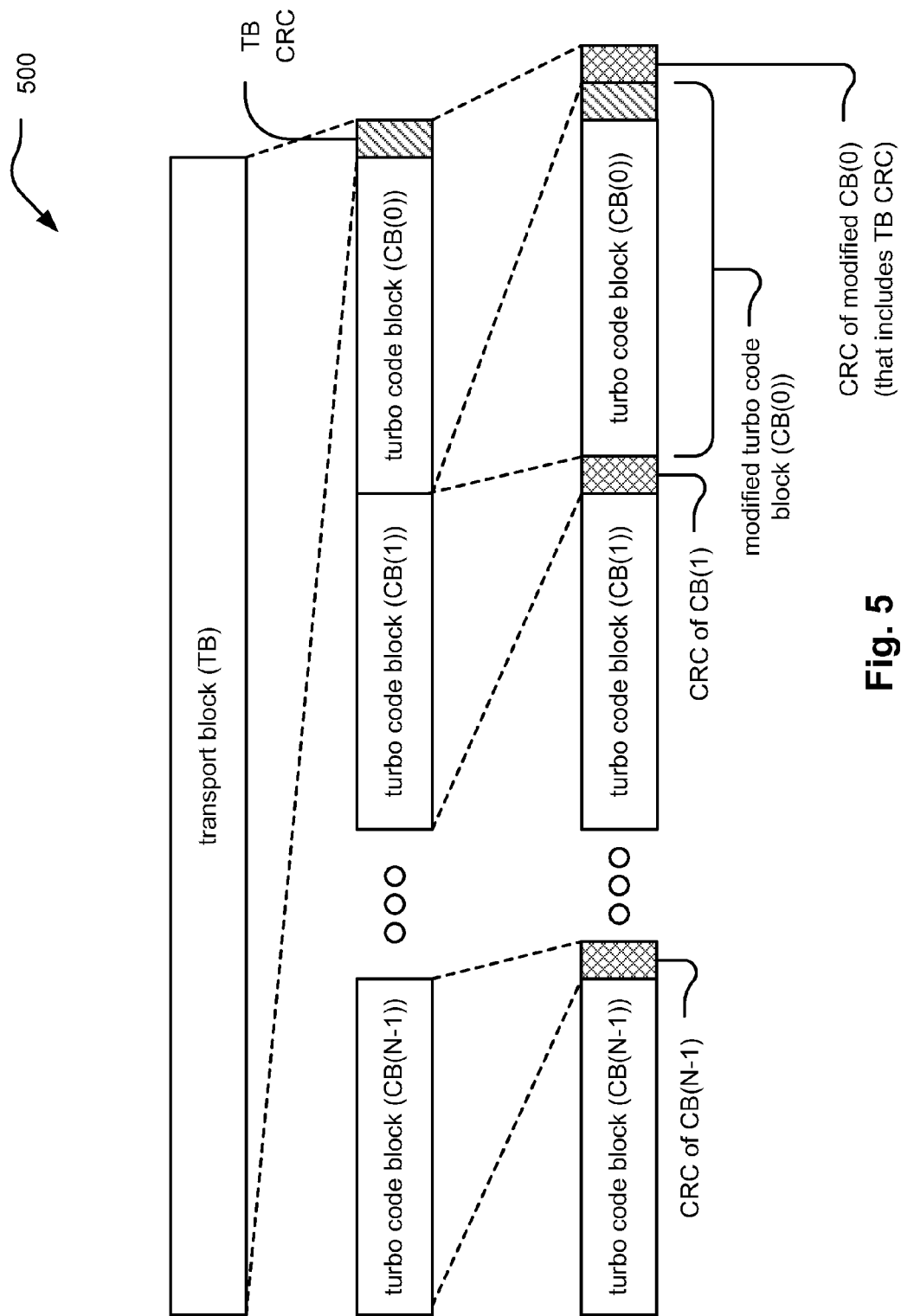
FIG. 5 illustrates an alternative embodiment of polynomial representation of binary vectors two layered CRC.

FIG. 5 illustrates an alternative embodiment of polynomial representation of binary vectors two layered CRC 500.

Following the convention in communication industry we represent a binary vector of size n, $x_0, x_1, \ldots x_{n-1}$ by a polynomial X(D) of degree n−1, namely $$(x_0, x_1, \ldots, x_{n-1}) \leftrightarrow X(D) = x_{n-1}D^{n-1} + x_{n-2}D^{n-2} + \ldots x_1 D + x_0$$

In this document we denote L the size of CRC redundancy, $G_{TB}(D)$ the CRC generator polynomial for TB, and $G_{CB}(D)$ the CRC generator polynomial for CB. Denote i-th CB by CB(i) and its size by $k_i$. In this document, we only consider the case that one TB has N>1 CBs, see FIG. 5. In fact, when N=1 TB CRC is CB CRC.

An information stream in CB(i) can be represent by a binary polynomial I(D) of degree less than $k_i$ and the codeword after CRC encoding is $I(D)D^L + CRC_{CB,i}(D)$ such that $\deg CRC_{CB,i}(D) < L$ and $I(D)D^L + CRC_{CB,i}(D) = G_{CB}(D)Q(D)$ for some polynomial Q(D).

Special Case: Undetectable Error on One Code Block

Consider a TB of two code blocks. In this section we study a special case that satisfies the following 3 conditions:

a) One code block, say CB(0), is correctly decoded;

b) The errors in the other code block, say CB(1), is undetectable; and c) The errors in TB is also undetectable.

This special case has been considered in [2]. However, the conclusion given by the following proposition is different to that in [2].

Proposition $$\#\{\text{Error vectors satisfying } a), b) \text{ and } c) \mid G_{TB}(D) = G_{CB}(D)\} =$$
$$\#\{\text{Error vectors satisfying } a), b) \text{ and } c) \mid G_{TB}(D) \neq G_{CB}(D)\} =$$
$$\#\{V(D) \neq 0 \mid \deg V(D) < k_1 - L\} = 2^{k_1 - L} - 1$$

Proof: See Appendix I.

This proposition shows the number of possible undetectable error vectors for the case that have same generator polynomial and that of the case with two different generator polynomials are the same.

In the following example, an error vector in CB(1) is constructed such that it is undetectable by two layers CRC system with two different CRC polynomials.
Example Let L=24 and $G_{TB}(D)$ and $G_{CB}(D)$ be as listed in the way forward proposal R1-074105[3], i.e.

$$G_{TB}(D) = D^{24} + D^{23} + D^{18} + D^{17} + D^{14} + D^{11} + D^{10} + D^{7} + D^{6} + D^{5} + D^{4} + D^{3} + D + 1$$

$$G_{CB}(D) = D^{24} + D^{23} + D^{6} + D^{5} + D + 1$$

Take $U(D) = D^{24} + D^{18} + D^{14} + D^{13} + D^{12} + D^{10} + D^{9} + D^{8} + D^{4} + 1$ and $$E_{1,2}(D) = D^{20} + D^{19} + D^{18} + D^{17} + D^{16} + D^{15} + D^{13} + D^{12} + D^{11} + D^{10} + D^{9} + D^{8} + D^{6} + D^{4} + 1$$

We have $$G_{CB}(D)U(D) = G_{TB}(D)D^{L} + E_{1,2}(D) \quad \text{(EQ-1)}$$

Take $E_1(D) = G_{CB}(D)U(D)$ as an error vector. Then it will not be detected by CB CRC. Since deg $E_{1,2}(D) = 20 < 24 = L$, by (EQ-1) the error vector remains for TB CRC is $G_{TB}(D)$ which will also not be detected by TB CRC. Thus $E_1(D)$ is undetectable using the two layers CRC of two different generator polynomials General: Number of all Possible Error Vectors Undetectable by Two Layered CRC Let $X_i(D)$, $i = 0, \ldots, N-1$ be N systematic vectors (polynomials) for N code blocks CB(i), $i = 0, 1, \ldots, N-1$. Then deg $X_i(D) < k_i$. Let $CRC_{TB}(D)$ be the CRC redundancy of TB, then $$\left| \left[ \sum_{i=1}^{N-1} X_i(D) D^{\{L + \sum_{j=0}^{i-1} k_j\}} + X_0(D) D^{L} + CRC_{TB}(D) \right] \right| = G_{TB}(D)H(D) \quad \text{(EQ-2)}$$

Let $CRC_i(D)$ be CRC redundancy of CB(i). Then $$X_i(D)D^{L} + CRC_i(D) = G_{CB}(D)Q_i(D), \quad i = 0, \ldots, N-1$$

An error vector on a TB after turbo decoding can be represented by a degree $$\left[ \sum_{i=1}^{N-1} (k_i + L) \right] + (k_0 + 2L) - 1$$

polynomial $E(D)$. This error polynomial can be decompose into $$E(D) = E_0(D) + E_1(D)D^{k_0 + 2L} + E_2(D)D^{k_0 + k_1 + 3L} + \ldots + E_{N-1}(D)D^{k_0 + \ldots k_{N-2}NL} \quad \text{(EQ-3)}$$

where $\deg(E_0(D)) < k_0 + 2L$ and $\deg(E_i(D)) < k_i + L$ for $i = 1, \ldots, N-1$.
Moreover, we can denote $$E_i(D) = E_{i,1}(D)D^{L} + E_{i,2}(D), \quad i = 0, 1, \ldots, N-1$$

such that deg $E_{0,1}(D) < k_0 + L$ and deg $E_{i,1}(D) < k_i$ for $i > 0$, and deg $E_{i,2}(D) < L$ for $i \geq 0$.
If the error vector $E(D)$ is undetected by two layers CRC, then $$E_{i,1}(D)D^{L} + E_{i,2}(D) = G_{CB}(D)V_i(D), \quad i = 0, \ldots, N-1 \text{ and}$$

$$E_{0,1}(D) + E_{1,1}(D)D^{k_0 + L} + E_{2,1}(D)D^{k_0 + k_1 + L} + \ldots + E_{N-1,1}(D)D^{k_0 + \ldots k_{N-2} + L} = G_{TB}(D)W(D) \quad \text{(EQ-4)}$$

Theorem $$\#\{\text{Error vectors undetectable by two layers } CRC \mid G_{TB}(D) = G_{CB}(D)\} =$$
$$\#\{\text{Error vectors undetectable by two layers } CRC \mid G_{TB}(D) \neq G_{CB}(D)\} =$$
$$\#\left\{ U(D) \neq 0 \,\middle|\, deg U(D) < \sum_{i=0}^{N-1} k_i \right\} = 2^{\sum_{i=1}^{N} k_i} - 1$$

Sketch of the proof: Without using the conditions of either $G_{CB}(D) = G_{TB}(D)$ or $G_{CB}(D) \neq G_{TB}(D)$, we prove the following two conclusions.

Conclusion 1: For any given error vector $E(D)$ undetectable by two layers CRC, there exist a polynomial $U(D)$ of degree less than $$\sum_{i=0}^{N-1} k_i$$

such that $E(D)$ is uniquely determined by $U(D)$.

Conclusion 2: Using any polynomial $U(D)$ of degree less than $$\sum_{i=0}^{N-1} k_i$$

one can construct an error vector $E(D)$ that will be undetected by two layers CRC.

Proof: See Appendix II.

Conclusion

It is proven that the number of possible error events that are undetectable by two layers CRC does not depend on whether $G_{CB}(D) = G_{TB}(D)$ or $G_{CB}(D) \neq G_{TB}(D)$. Therefore, herein, a single CRC polynomial (e.g., generation polynomial) is employed for multiple layers of CRC encoding (e.g., for both the CRC check employed for the individual CBs and also jointly for the TB CRC check as well in one embodiment).

Figure 6:
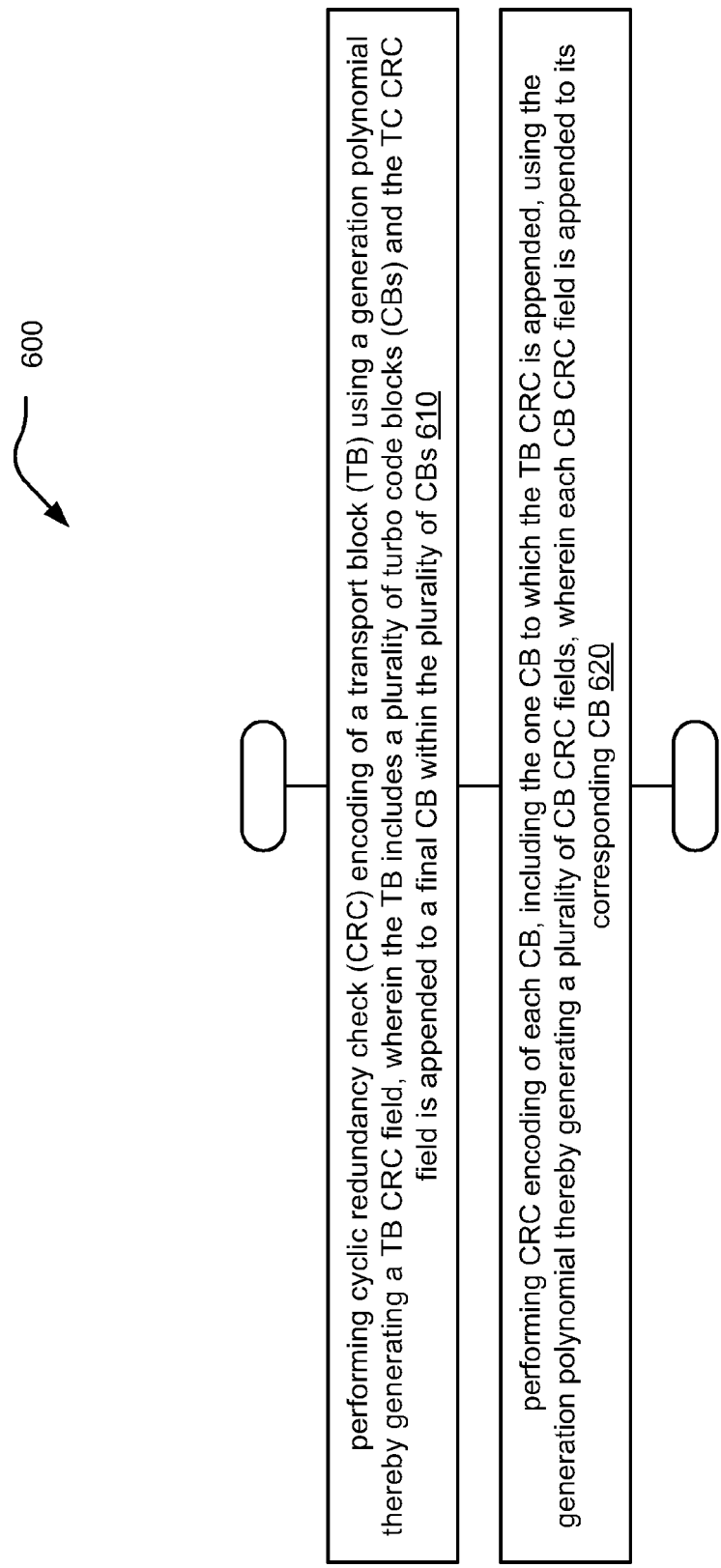
FIG. 6 illustrates an embodiment of a method for performing cyclic redundancy check (CRC) encoding.

FIG. 6 illustrates an embodiment of a method 600 for performing cyclic redundancy check (CRC) encoding. The method 600 begins by performing cyclic redundancy check (CRC) encoding of a transport block (TB) using a generation polynomial thereby generating a TB CRC field, wherein the TB includes a plurality of turbo code blocks (CBs) and the TC CRC field is appended to a final CB within the plurality of CBs, as shown in a block 610. The method 600 continues by performing CRC encoding of each CB, including the one CB to which the TB CRC is appended, using the generation polynomial thereby generating a plurality of CB CRC fields, wherein each CB CRC field is appended to its corresponding CB, as shown in a block 620. The method 600 can be performed within a wireless personal communication device.

Figure 7:
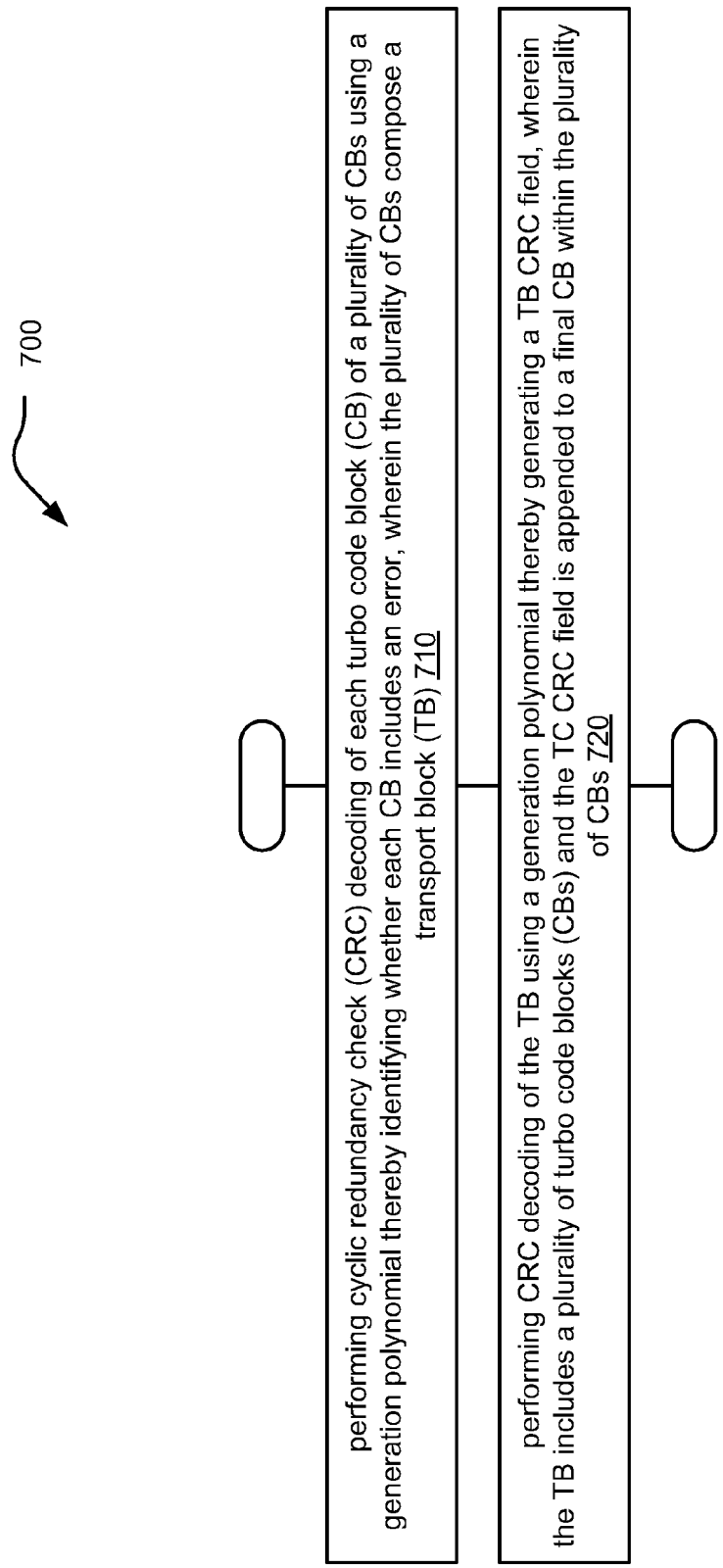
FIG. 7 illustrates an embodiment of a method for performing CRC decoding.

FIG. 7 illustrates an embodiment of a method 700 for performing CRC decoding. The method 700 begins by performing cyclic redundancy check (CRC) decoding of each turbo code block (CB) of a plurality of CBs using a generation polynomial thereby identifying whether each CB includes an error, wherein the plurality of CBs compose a transport block (TB), as shown in a block 710. The method 700 continues by performing CRC decoding of the TB using a generation polynomial thereby generating a TB CRC field, wherein the TB includes a plurality of turbo code blocks (CBs) and the TC CRC field is appended to a final CB within the plurality of CBs, as shown in a block 720. The method 700 can be performed within a wireless personal communication device.

Figure 8:
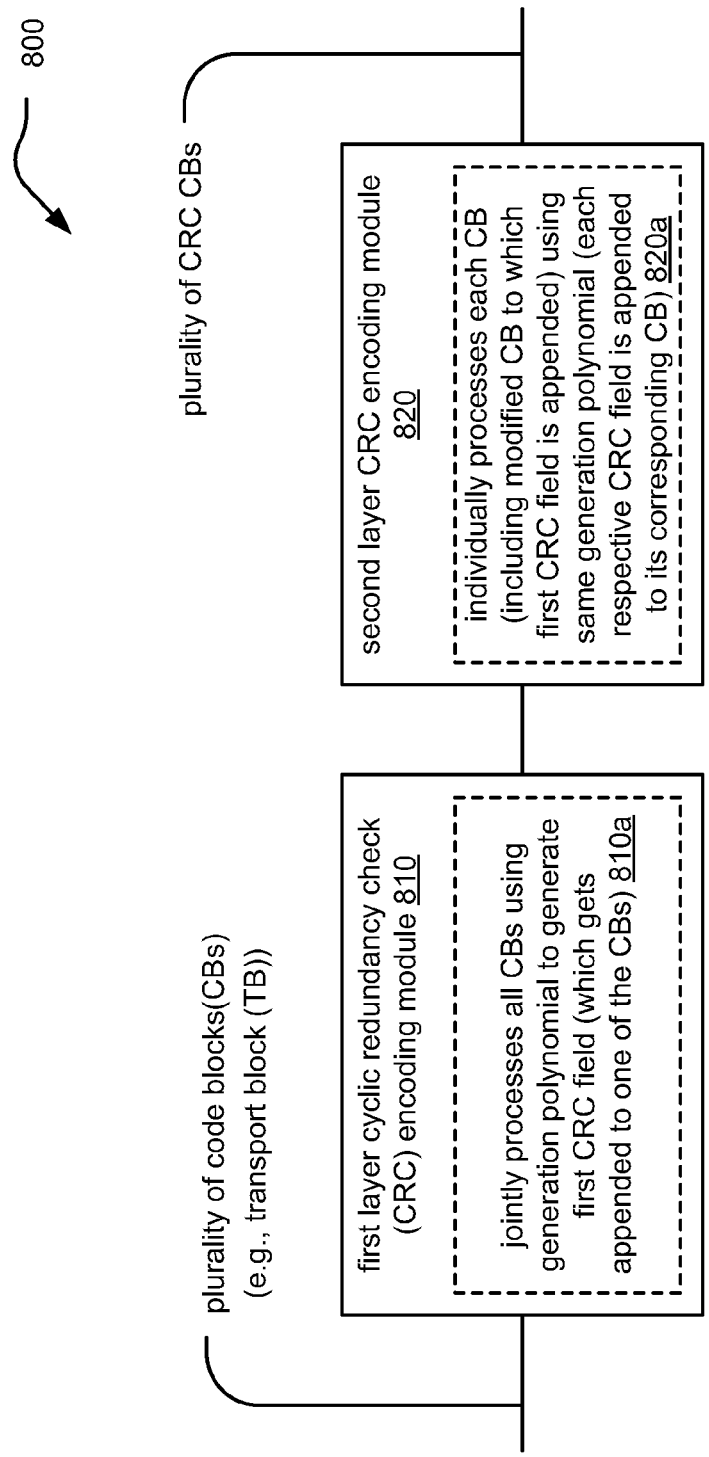
FIG. 8 illustrates an embodiment of an apparatus that performs CRC encoding.

FIG. 8 illustrates an embodiment of an apparatus 800 that performs CRC encoding. A first layer cyclic redundancy check (CRC) encoding module 810 receives a plurality of code blocks (CBs). The type of encoding by which the plurality of CBs may be generated may be any one or combination of desired types of coding including turbo coding, turbo trellis coding, LDPC (Low Density Parity Check) coding, Reed-Solomon (RS) coding, etc.

Together, the plurality of CBs may be viewed as being a transport block (TB). The first layer CRC encoding module 810 jointly processes the plurality of CBs using a generation polynomial to generate a first CRC field, as shown in a block 810*a*. This first CRC field is generated from and corresponds to all of the plurality of CBs being processed as a given time (e.g., for a first group of CBs processed at a first time). Subsequently, when different groups of CBs are processed, different corresponding "CRC fields" are generated from and correspond to those different groups of CBs.

Continuing on with this embodiment, once the first CRC field is generated using the plurality of CBs, then the first CRC field is appended to one of the CBs thereby generating a modified CB. The one CB to which the first CRC field is appends may be any one of the CBs.

The plurality of CBs (including the one modified CB that includes the first CRC field appended thereto) is then output and provided to a second layer CRC encoding module 820. Whereas the first layer CRC encoding module 810 jointly processes all of the CBs together, the second layer CRC encoding module 820 individually processes each of the plurality of CBs (including the modified CB that includes the first CRC field) using the same generation polynomial to generate a plurality of CRC fields such that each CRC field corresponds to one of the plurality of CBs. For example, each CRC field generated by the second layer CRC encoding module 820 corresponds to only one of the CBs. Clearly, one of the CRC fields generated by the second layer CRC encoding module 820 corresponds to the modified CB (i.e., the one CB to which the first CRC field is appended within the first layer CRC encoding module 810). The second layer CRC encoding module 820 then operates by appending each respective CRC field of the plurality of CRC fields to its corresponding CB of the plurality of CBs thereby generating a plurality of CRC CBs. The plurality of CRC CBs is then output by the apparatus 800.

Figure 9:
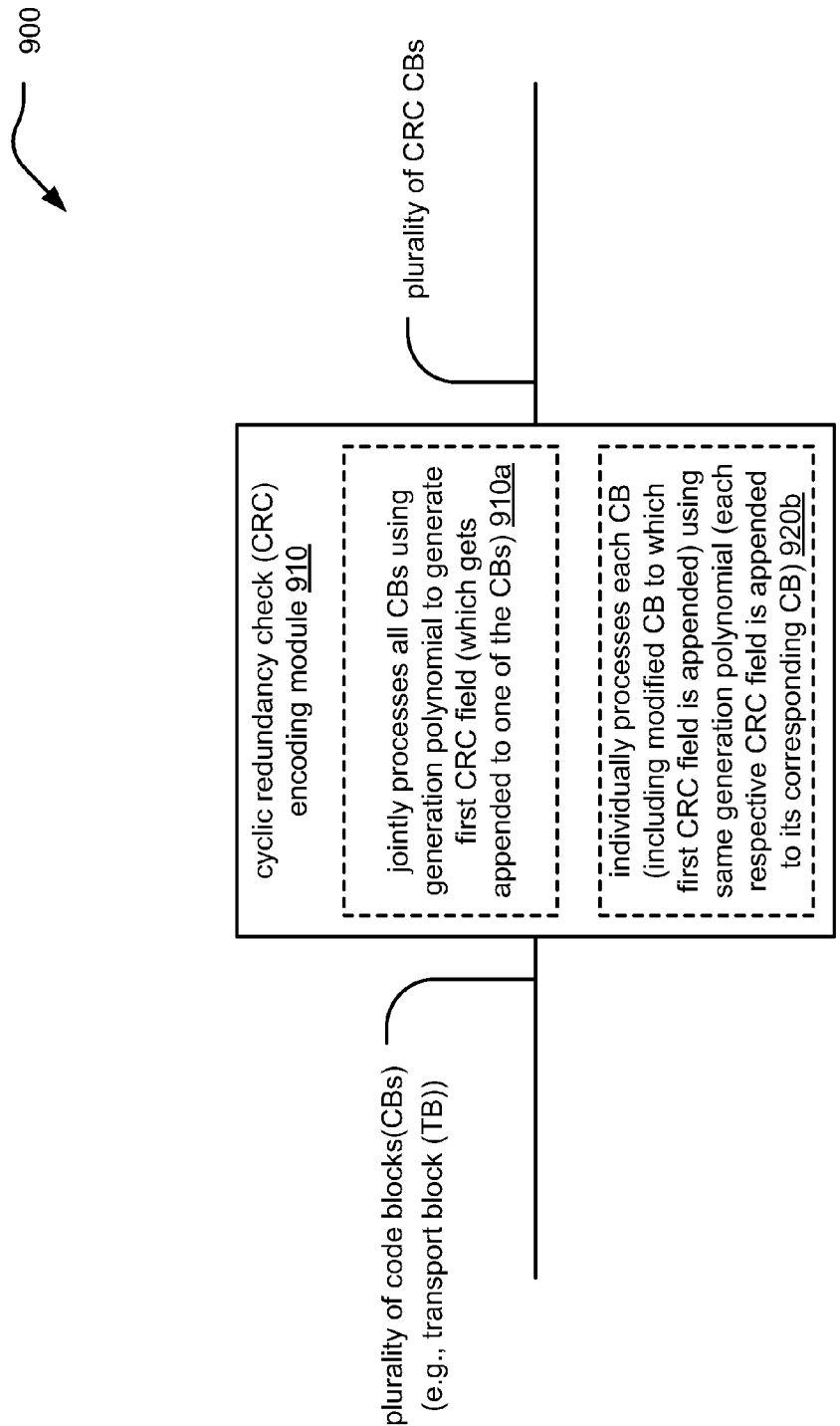
FIG. 9 illustrates an alternative embodiment of an apparatus that performs CRC encoding.

FIG. 9 illustrates an alternative embodiment of an apparatus 900 that performs CRC encoding. This embodiment is somewhat analogous to the previous embodiment, with at least one difference being that a single CRC encoding module 910 performs the operations of both the first CRC encoding module 810 and the second CRC encoding module 820 of the previous embodiment. Functionality, different circuitry components may be implemented within the CRC encoding module 910 to effectuate the different CRC encoding therein. However, given that a singular generation polynomial is employed for the various layers of CRC encoding, then hardware savings can be achieved. When the various layers of CRC encoding are implemented by a software process as performed by a processing module (e.g., by the CRC encoding module 910), then the various layers of CRC encoding may be viewed as being different software loops. Again, however, given that a singular generation polynomial is employed for the various layers of CRC encoding, then software savings (e.g., reduction is software complexity) can likewise be achieved.

The CRC encoding module 910 receives a plurality of CBs. As with the previous embodiment, the plurality of CBs may together be viewed as being a TB. A first layer CRC encoding is performed by block 910*a* that jointly processes the plurality of CBs using a generation polynomial to generate a first CRC field. This first CRC field is generated from and corresponds to all of the plurality of CBs being processed as a given time (e.g., for a first group of CBs processed at a first time). Once the first CRC field is generated using the plurality of CBs, then the first CRC field is appended to one of the CBs thereby generating a modified CB. The one CB to which the first CRC field is appends may be any one of the CBs.

The plurality of CBs (including the one modified CB that includes the first CRC field appended thereto) is then processed by the block 920*b*. A second layer CRC encoding is performed by block 920*b* that individually processes each of the plurality of CBs (including the modified CB that includes the first CRC field) using the same generation polynomial to generate a plurality of CRC fields such that each CRC field corresponds to one of the plurality of CBs. For example, each CRC field generated by the block 920*b* corresponds to only one of the CBs. Clearly, one of the CRC fields generated by the second layer CRC encoding in block 920*b* corresponds to the modified CB (i.e., the one CB to which the first CRC field is appended in block 910*a*). The second layer CRC encoding in block 920*b* then operates by appending each respective CRC field of the plurality of CRC fields to its corresponding CB of the plurality of CBs thereby generating a plurality of CRC CBs. The plurality of CRC CBs is then output by the apparatus 900.

Figure 10:
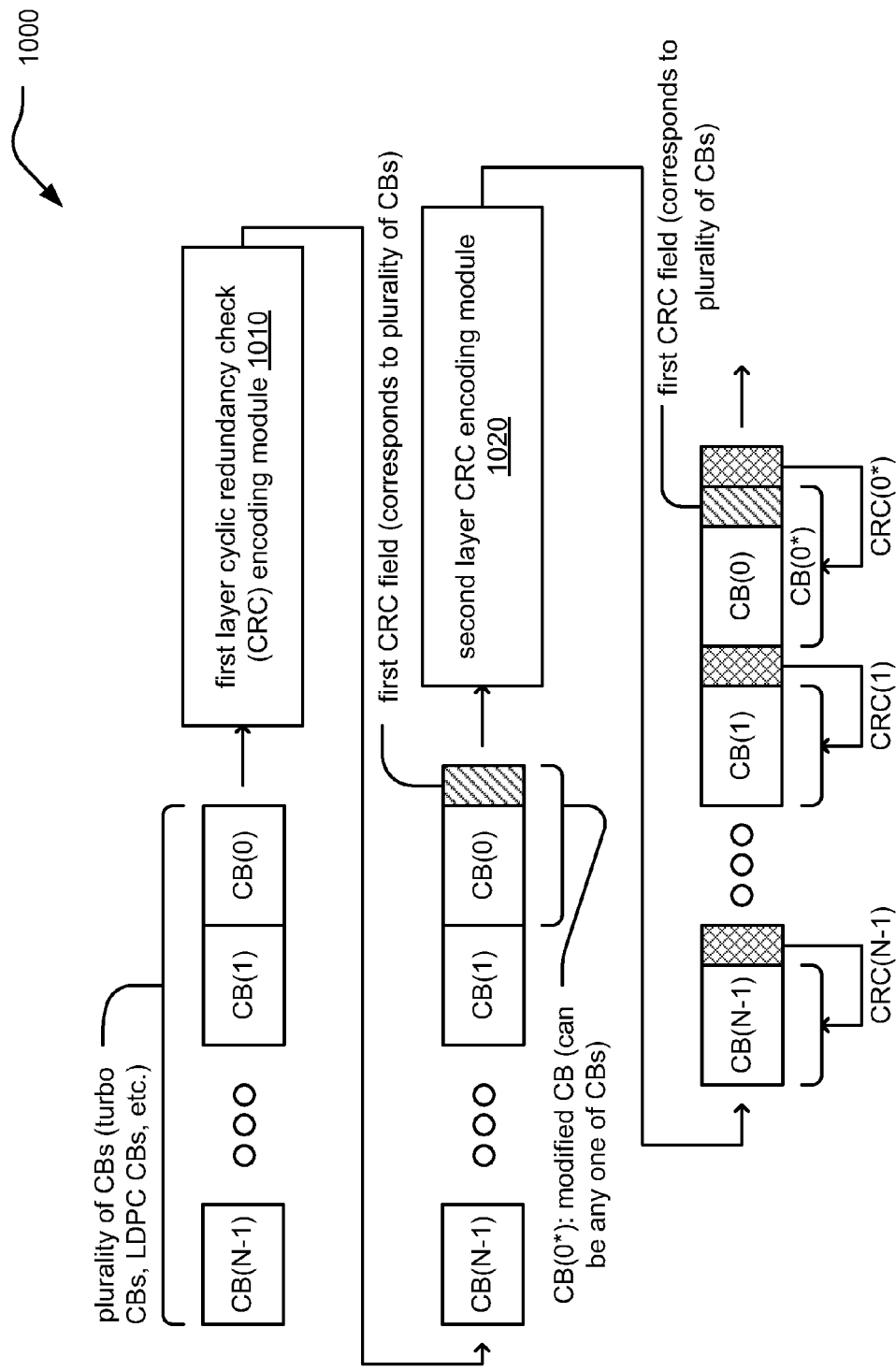
FIG. 10 illustrates an alternative embodiment of an apparatus that performs CRC encoding.

FIG. 10 illustrates an alternative embodiment of an apparatus 1000 that performs CRC encoding. This embodiment shows pictorially how a plurality of CBs (e.g., generated using any one or combination of turbo code, LDPC code, etc.) may be modified by a first layer CRC encoding module 1010 to generate a single (i.e., first) CRC field that corresponds to the plurality of CBs. The first layer CRC encoding module 1010 does this by jointly processing all of the plurality of CBs to generate the first CRC field.

As can be seen in this embodiment, the first CRC field if appended to one of the CBs (i.e., shown as CB(0) in this embodiment). This then forms a modified CB, which may be depicted as CB(0*) to distinguish it from the other CBs in the sequence.

A second layer CRC encoding module 1020 then operates to process the CBs (including the modified CB to which the first CRC field is appended) individually to generate a plurality of CRC fields such that each CRC field corresponds to one of the plurality of CBs. Clearly, one of these CRC fields generated by the second layer CRC encoding module 1020 corresponds to the modified CB (i.e., the one CB to which the first CRC field is appended).

Figure 11:
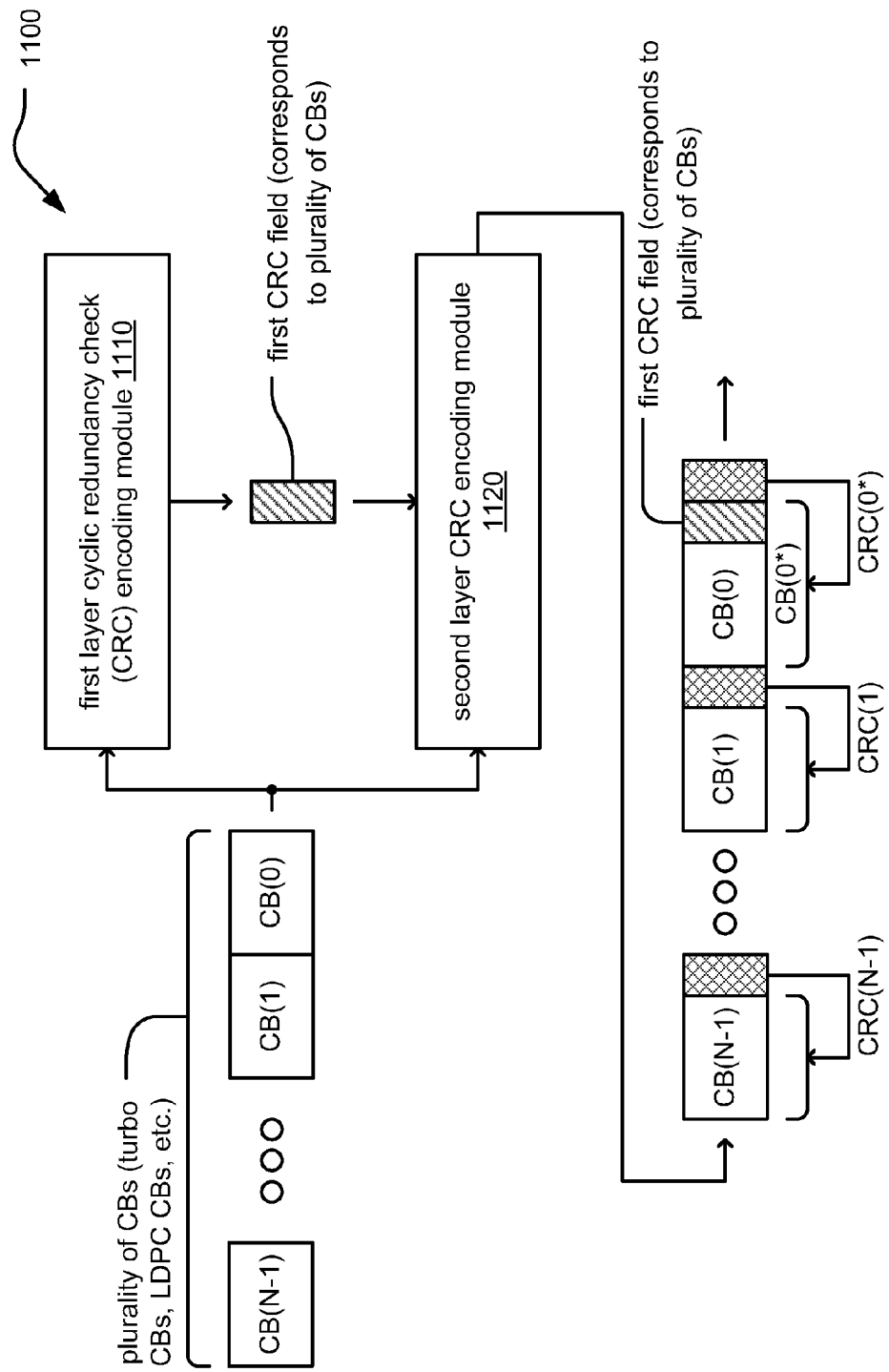
FIG. 11 illustrates an alternative embodiment of an apparatus that performs CRC encoding.

FIG. 11 illustrates an alternative embodiment of an apparatus 1100 that performs CRC encoding. This embodiment has some similarities to the previous embodiment, with at least one difference being that a plurality of CBs (e.g., generated using any one or combination of turbo code, LDPC code, etc.) is provided to both of a first layer CRC encoding module 1110 and to a second layer CRC encoding module 1120. The first layer CRC encoding module 1110 jointly processes all of the plurality of CBs to generate a first CRC field that corresponds to all of the plurality of CBs. This first CRC field is passed to the second layer CRC encoding module 1120. The second layer CRC encoding module 1120 individually processes the plurality of CBs to generate a plurality of CRC fields.

The second layer CRC encoding module 1120 can begin operating on the plurality of CBs, but it waits until it receives the modified CB (i.e., the one CB to which the first CRC field gets appended by the first layer CRC encoding module 1110) before it generates that respective CRC field. However, an increase in processing speed may potentially be achieved in this embodiment when compared to the previous embodiment. The second layer CRC encoding module 1120 then outputs a plurality of CRC CBs (i.e., the plurality of CBs such that each respective CB has a corresponding CRC field appended thereto).

FIG. 12A, FIG. 12B, and FIG. 12C illustrate embodiments of various manners by which multi-level CRC encoding maybe performed.

It is noted that the first CRC field (e.g., generated using a first layer of CRC encoding) can be appended to any one of the CBs as desired within a particular application.

Referring to embodiment 1200a of FIG. 12A, the first CRC field (as generated by a first layer of CRC encoding) is shown as being appended to a first one of the CBs (i.e., CB(0))) in the sequence, which together form the modified CB (shown as CB(0*)). The corresponding CRC field of this modified CB is shown as CRC(0*).

Referring to embodiment 1200b of FIG. 12B, the first CRC field (as generated by a first layer of CRC encoding) is shown as being appended to a second one of the CBs (i.e., CB(1))) in the sequence, which together form the modified CB (shown as CB(1*)). The corresponding CRC field of this modified CB is shown as CRC(1*).

Referring to embodiment 1200c of FIG. 12C, the first CRC field (as generated by a first layer of CRC encoding) is shown as being appended to a last one of the CBs (i.e., CB(N−1))) in the sequence, which together form the modified CB (shown as CB((N−1)*)). The corresponding CRC field of this modified CB is shown as CRC((N−1)*).

Figure 13:
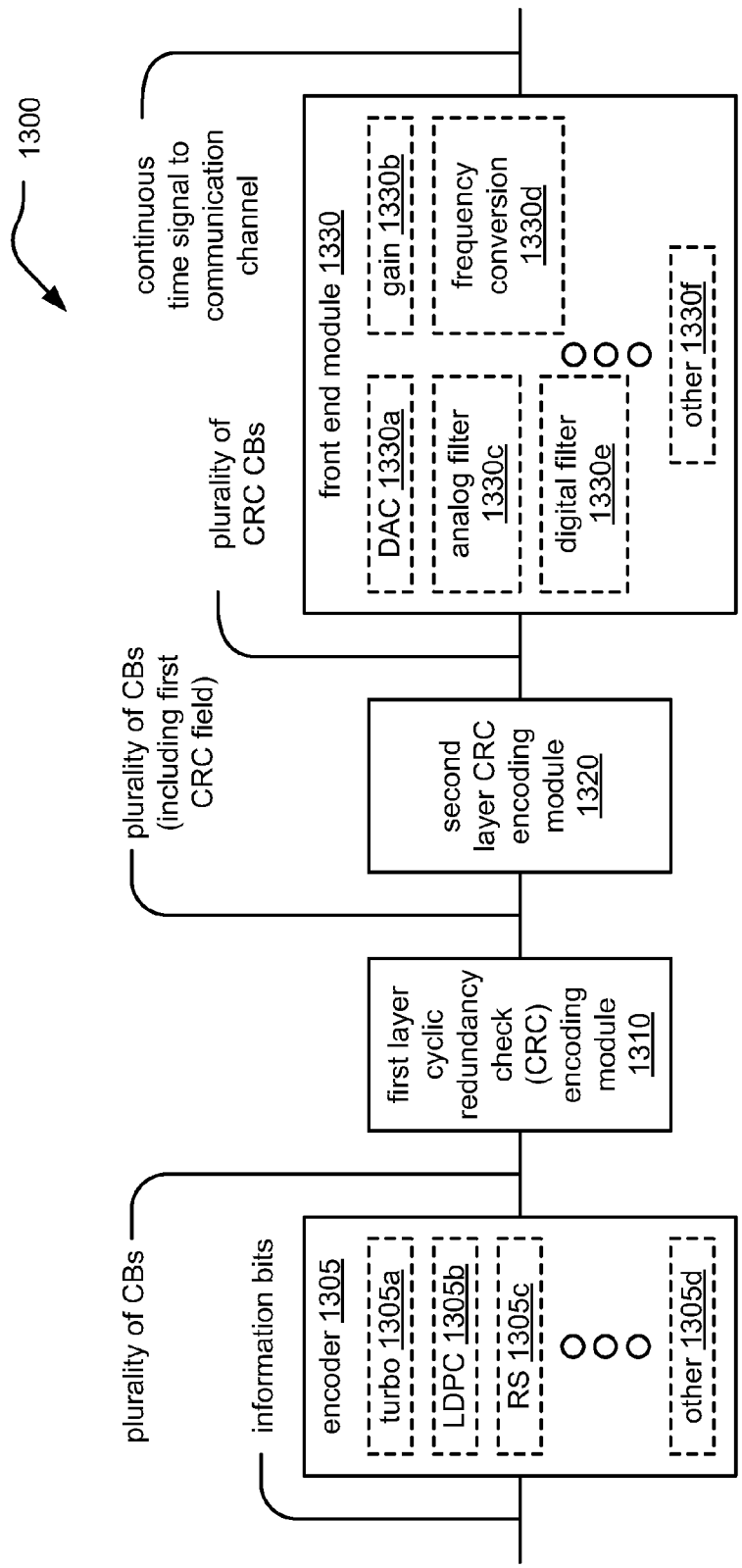
FIG. 13 illustrates an embodiment of an apparatus that generates a continuous time signal that comports with a communication channel.

FIG. 13 illustrates an embodiment of an apparatus 1300 that generates a continuous time signal that comports with a communication channel. Information bits are received by an encoder 1305 that performs encoding thereon to generate a plurality of CBs. The encoding performs by the encoder 1305 may be using one or combination of a variety of types of codes (e.g., turbo coding as shown by block 1305a, LDPC coding as shown by block 1305b, RS coding as shown by block 1305c, and/or any other type of coding as shown by block 1305d, etc.).

The plurality of CBs are then received by a first layer CRC encoding module 1310 jointly processes the plurality of CBs and generates a first CRC field that gets appended to one of the plurality of CBs. A second layer CRC encoding module 1320 then individually processes each of the plurality of CBs, including the modified CB that includes the first CRC field, to generate a plurality of CRC fields such that each CRC field corresponds to one of the plurality of CBs.

The first layer CRC encoding module 1310 and the second layer CRC encoding module 1320 employ a same generation polynomial when performing their performing CRC encoding. The second layer CRC encoding modules 120 then outputs a plurality of CRC CBs that get provided to a front end module 1330.

This front end module 1330 receives the plurality of CRC CBs (that is a digital signal) and performs appropriate processing thereon to generate a continuous time signal that comports with a communication channel to which the apparatus 1330 is coupled. The front end module 1330 may perform a number of functions in any preferable order including digital to analog conversion (DAC) 1330a, gain adjustment 1330b, analog filtering 1330c, frequency conversion 1330d (e.g., up or down), digital filtering 1330e, and/or any other digital or analog processing function 1330f. Depending on the type of communication channel to which the apparatus 1300 is coupled and the type of communication system in which the apparatus 1300 operates, the characteristics of the continuous time signal has the appropriate characteristics to be launched into that particular type of communication channel (e.g., whether it be a satellite communication system, a wireless communication system, a wired communication system, a fiber-optic communication system, etc.).

Figure 14:
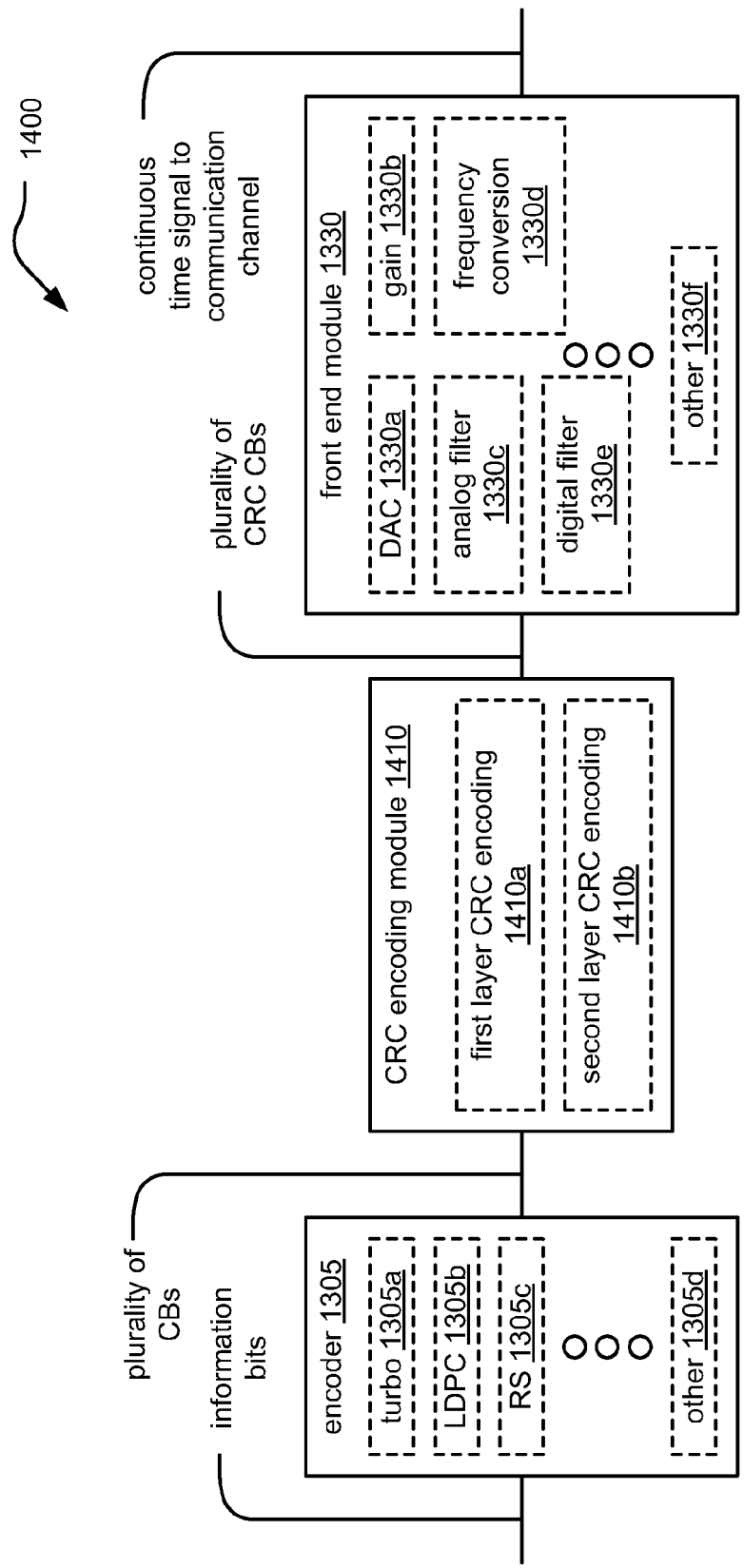
FIG. 14 illustrates an alternative embodiment of an apparatus that generates a continuous time signal that comports with a communication channel.

FIG. 14 illustrates an alternative embodiment of an apparatus 1400 that generates a continuous time signal that comports with a communication channel. This embodiment is similar to the previous embodiment, with at least one difference being that a single CRC encoding module 1410 performs both a first layer CRC encoding 1410a and a second CRC encoding module 1410b.

Functionality, different circuitry components may be implemented within the CRC encoding module 1410 to effectuate the different CRC encoding therein. However, given that a singular generation polynomial is employed for the various layers of CRC encoding, then hardware savings can be achieved. When the various layers of CRC encoding are implemented by a software process as performed by a processing module (e.g., by the CRC encoding module 1410), then the various layers of CRC encoding may be viewed as being different software loops. Again, however, given that a singular generation polynomial is employed for the various layers of CRC encoding, then software savings (e.g., reduction is software complexity) can likewise be achieved.

Figure 15:
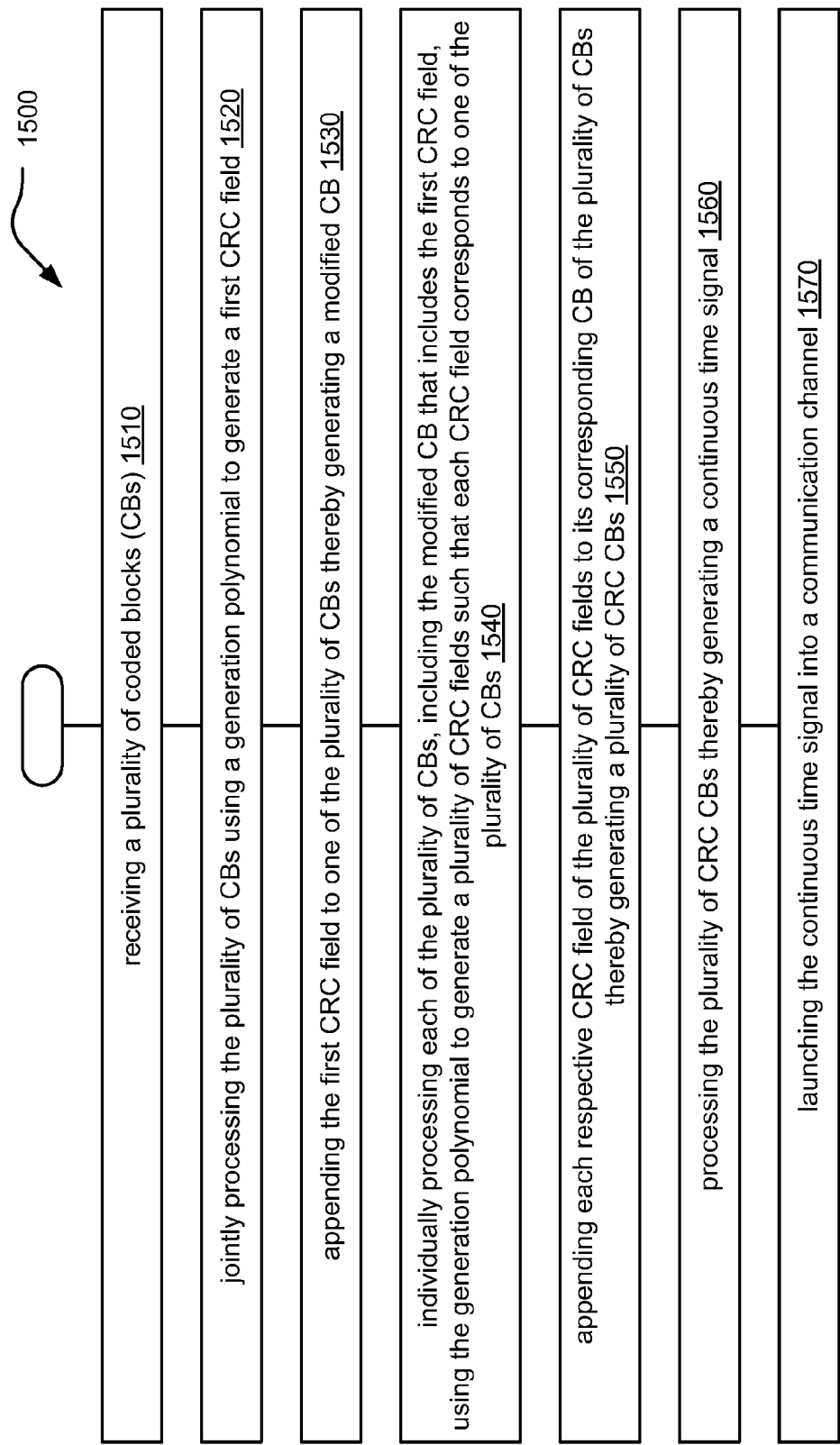
FIG. 15 illustrates an embodiment of a method that involves CRC encoding.

FIG. 15 illustrates an embodiment of a method 1500 that involves CRC encoding. The method 1500 begins by receiving a plurality of CBs, as shown in a block 1510. The method 1500 then continues by jointly processing the plurality of CBs using a generation polynomial to generate a first CRC field, as shown in a block 1520. The method 1500 then continues by appending the first CRC field to one of the plurality of CBs thereby generating a modified CB, as shown in a block 1530.

The method 1500 then continues by individually processing each of the plurality of CBs, including the modified CB that includes the first CRC field, using the generation polynomial to generate a plurality of CRC fields such that each CRC field corresponds to one of the plurality of CBs, as shown in a block 1540. The method 1500 then continues by appending each respective CRC field of the plurality of CRC fields to its corresponding CB of the plurality of CBs thereby generating a plurality of CRC CBs, as shown in a block 1550. The method 1500 then continues by processing the plurality of CRC CBs thereby generating a continuous time signal, as shown in a block 1560. The method 1500 then continues by launching the continuous time signal into a communication channel, as shown in a block 1570.

It is noted that the various modules (e.g., processing modules, encoding modules, front end modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

References

[1] 3GPP TS 36.212 V8.2.0, "3rd Generation Partnership Project; Technical Specification Group Radio Access Network; Evolved Universal Terrestrial Radio Access (E-UTRA); Multiplexing and Channel Coding (Release 8)," 2008 March, 38 pages.

[2] 3GPP TSG-RAN WG1 #50bis, R1-074492, "Details on Probabilities of Undetected TB Errors," Ericsson, Oct. 8-12, 2007, 9 pages.

[3] 3GPP TSG-RAN Working Group 1 #50bis, R1-074473, "TB CRC generator polynomial," Ericsson, ETRI, ITRI, LGE, Motorola, Nokia, Nokia Siemens Networks, Nortel, Qualcomm, Samsung, Oct. 8-12, 2007, 1 page.

Appendix I: Proof of Proposition

To prove the proposition we need the following well known lemma.

Lemma 1 Let G(D) be a binary polynomial. Then for any given binary polynomial Y(D) there exist two unique polynomials Q(D) and r(D) such that $X(D)=G(D)Q(D)+r(D)$ with $\deg r(D)<\deg G(D)$.

Proof of Proposition Let E'(D) be an error vector that satisfy Conditions a)-c). By Condition a) it must be in CB(1). Thus $E'(D)=E(D)D^{k_0+2L}$ with $\deg E(D) \leq k_1+L$. Condition b) tells that this error vector cannot be detected by CB(1) CRC. Thus, $E(D)=G_{CB}(D)H(D)$ with $\deg H(D) \leq k_1$. Let us denote $E(D)=E_1(D)D^L+E_2(D)$ with $\deg E_1(D) \leq k_2$ and $\deg E_2(D)<L$. Condition c) implies that $E_1(D)$ cannot be detected by TB CRC, i.e. $E_1(D)=G_{TB}(D)V(D)$ with $\deg V(D)<k_2-L$.

Equal Case ($G_{TB}(D)=G_{CB}(D)$): In this case we have $E_1(D)=G_{CB}(D)V(D)$. Thus $G_{CB}(D)V(D)D^L+E_2(D)=G_{CB}(D)H(D)$. This implies $E_2(D)=0$ since $\deg E_2(D)<L$. Thus $E(D)=E_1(D)D^L=G_{CB}(D)V(D)D^L$.

This implies that E(D) is determined by polynomial V(D) of degree less thank $k_1-L$. Therefore $\#\{\text{Error vectors satisfying } a),b) \text{ and } c) | G_{TB}(D)=G_{CB}(D)\} \leq \#\{V(D) \neq 0 | \deg V(D) < k_1-L\}$ (EQ-5)

On the other hand, for any polynomial V(D) of degree less thank $k_1-L$, take $E(D)=G_{CB}(D)V(D)D^L=G_{TB}(D)V(D)D^L$. (EQ-6)

Take error vector $E'(D)=E(D)D^{k_0+2L}$ as an error vector. This error vector satisfies Condition a). (EQ-6) implies that E(D) cannot be detected by CB CRC, i.e. satisfy Condition b) is satisfied. Since the minimal term degree of E(D) is at least L this error vector will passed to TB. Then by (EQ-6) again $E'(D)=E(D)D^{k_0+2L}$ cannot be detected by TB CRC, i.e. it satisfies Condition c). Therefore $\#\{\text{Error vectors satisfying } 1),2) \text{ and } 3) | G_{TB}(D)=G_{CB}(D)\} \geq \#\{V(D) \neq 0 | \deg V(D) < k_1-L\}$ (EQ-7)

Combining (EQ-5) and (EQ-7), we have $\#\{\text{Error vectors satisfying } a),b) \text{ and } c) | G_{TB}(D)=G_{CB}(D)\} = \#\{V(D) \neq 0 | \deg V(D) < k_1-L\} = 2^{k_1-L}-1$ Unequal Case ($G_{CB}(D) \neq G_{TB}(D)$): By Condition c) $E_1(D)=G_{TB}(D)V(D)$.

Thus $E(D)=G_{CB}(D)H(D)=G_{TB}(D)V(D)D^L+E_2(D)$ with $\deg E_2(D)<L=\deg G_{CB}(D)$. By Lemma 1, $E_2(D)$ and H(D) are uniquely determined by V(D). Therefore, E(D) is also determined by V(D). Thus $\#\{\text{Error vectors satisfying } a),b) \text{ and } c) | G_{TB}(D) \neq G_{CB}(D)\} \leq \#\{V(D) \neq 0 | \deg V(D) < k_1-L\}$ (EQ-8)

On the other hand, for any polynomial V(D) of degree less than $k_2-L$, by Lemma 1 there always exist tow unique polynomials H(D) and $E_2(D)$ such that $G_{TB}(D)V(D)D^L=G_{CB}(D)H(D)+E_2(D)$ with $\deg E_2(D)<L$.

Denote $E(D)=G_{CB}(D)H(D)$ and take error vector $E'(D)=E(D)D^{k_0+2L}$. Then this error vector satisfies Condition a) and it cannot be detected by CB CRC, i.e. satisfy Condition b). Since $E(D)-E_2(D)=G_{TB}(D)V(D)D^L$, the error vector pass to TB is $G_{TB}(D)V(D)D^{L+k_1}$ which cannot be detected by TB CRC, i.e. Condition c) is satisfied. Therefore $\#\{\text{Error vectors satisfying } a),b) \text{ and } c) | G_{TB}(D) \neq G_{CB}(D)\} \leq \#\{V(D) \neq 0 | \deg V(D) < k_1-L\}$ (EQ-9)

Combining (EQ-8) and (EQ-9), we have $\#\{\text{Error vectors satisfying } a),b) \text{ and } c) | G_{TB}(D) \neq G_{CB}(D)\} = \#\{V(D) \neq 0 | \deg V(D) < k_1-L\} = 2^{k_1-L}-1$ We have shown that the numbers of possible error vectors in two cases are the same. This proves the proposition.

Appendix II: Proof of Theorem

The following well known lemma will be used in the proof.

Lemma 2 Let G(D) be a CRC generator polynomial of degree L. Then, given any polynomial X(D) there exist a unique polynomial C(D) of degree less than L such that $X(D)D^L+C(D)$ is a code word of this CRC. i.e. $X(D)D^L+C(D)=G(D)Q(D)$.

Proof of Theorem: Let E(D) be an error vector after turbo decoding (as defined in Section 4) such that it cannot be detected by two layers CRC. Then, the individual error vector in CB(i), namely $E_i(D)$ as defined in (EQ-2) cannot be detected by CB CRC for i=0, ..., N−1. This implies that $E_i(D)$ is a CB CRC codeword, i.e.

$$E_i(D)=E_{i,1}(D)D^L+E_{i,2}(D)=G_{CB}(D)Q_i(D)$$

with deg $E_{i,1}(D)<k_i$ i>0, deg $E_{0,1}(D) \leq k_0+L$ and deg $E_{i,2}(D)$ <L, i≥0. By Lemma 2, we conclude $$E_{i,2}(D) \text{ is uniquely determined by } E_{i,1}(D). \quad \text{(EQ-10)}$$

The error vector after CB CRC is $$E_{N-1,1}(D)D^{\sum_{i=0}^{N-2}k_i+L} + \ldots + E_{11}(D)D^{k_0+L} + E_{01}(D).$$

By the assumption of the theorem, this error cannot be detected by TB CRC. This implies $$E_{N-1,1}(D)D^{\sum_{i=0}^{N-2}k_i+L} + \ldots + E_{11}(D)D^{k_0+L} + E_{01}(D) = \quad \text{(EQ-11)}$$
$$G_{TB}(D)U(D)$$

Thus $(E_0(D), E_1(D), \ldots, E_{N-1,1}(D))$ is determined by polynomial U(D), and so does the error vector E(D) by (EQ-10). Since the degree of the left side of the polynomial in (EQ-11) is at most $$\sum_{j=0}^{N-1} k_i + L,$$

the degree of $G_{TB}(D)U(D)$ is also at most $$\sum_{j=0}^{N-1} k_i + L.$$

Thus the degree of U(D) is at most $$\sum_{j=0}^{N-1} k_i.$$

This proves
{Error vectors undetectable by two layers $$CRC \mid G_{TB}(D) = G_{CB}(D)\} \leq \#\left\{U(D) \neq 0 \;\middle|\; deg U(D) < \sum_{j=0}^{N-1} k_i \right\}$$

and
{Error vectors undetectable by two layers $$CRC \mid G_{TB}(D) \neq G_{CB}(D)\} \leq \#\left\{U(D) \neq 0 \;\middle|\; deg U(D) < \sum_{j=0}^{N-1} k_i \right\} \quad \text{(EQ-12)}$$

On the other hand, given any polynomial U(D) of degree less than $$\sum_{j=0}^{N-1} k_i.$$

There exist a polynomial vector $(E_0(D), E_1(D), \ldots, E_{N-1,1}(D))$ such that (EQ-11) hold. This shows that the error vector $$E_{N-1,1}(D)D^{\sum_{i=0}^{N-2}k_i+L} + \ldots + E_{11}(D)D^{k_0+L} + E_{01}(D)$$

cannot be detected by TB CRC. By Lemma 2, for every $E_{i,1}(D)$ there exists a polynomial $E_i(D)$ of degree less than $k_i+L$ for i>0 and deg $E_0(D)<k_0+2L$ such that $$E_i(D)=E_{i1}(D)D^L+E_{i2}(D)=G_{CB}(D)Q_i(D)$$

This means that the error vector $E_i(D)$ (which may be 0 for some i) cannot be detected by CB CRC. Therefore the error vector $$E(D)=E_0(D)+E_1(D)D^{k_0+2L}+E_2(D)D^{k_0+k_1+3L}+ \ldots + E_{N-1}(D)D^{k_0+\ldots+k_{N-2}+NL}$$

determined by U(D) will be undetected by two layers CRC. This proves
{Error vectors undetectable by two layers $$CRC \mid G_{TB}(D) = G_{CB}(D)\} \geq \#\left\{U(D) \neq 0 \;\middle|\; deg U(D) < \sum_{j=0}^{N-1} k_i \right\}$$

and
{Error vectors undetectable by two layers $$CRC \mid G_{TB}(D) = G_{CB}(D)\} \geq \#\left\{U(D) \neq 0 \;\middle|\; deg U(D) < \sum_{j=0}^{N-1} k_i \right\} \quad \text{(EQ-13)}$$

With (EQ-12) and (EQ-13), we can conclude

{Error vectors undetectable by two layers $CRC \mid G_{TB}(D) = G_{CB}(D)\}$ =

{Error vectors undetectable by two layers $CRC \mid G_{TB}(D) \neq G_{CB}(D)\}$ =

-continued $$\#\left\{U(D) \neq 0 \mid deg U(D) < \sum_{j=0}^{N-1} k_i\right\} = 2^{\sum_{j=0}^{N-1} k_i} - 1$$

What is claimed is:

1. An apparatus comprising:
    an input to receive a sequence including N coded blocks (CBs) that includes a first CB, a last CB, and a plurality of CBs that includes a second CB that is interposed between the first CB and the last CB, where N is an integer;
    a first cyclic redundancy check (CRC) encoder to employ a generation polynomial to process all of the N CBs to generate a first CRC field and to combine the first CRC field with the second CB to generate a modified CB and to generate a modified sequence including N−1 CBs and the modified CB;
    a second CRC encoder to employ the generation polynomial to process each of the N−1 CBs and the modified CB, of the modified sequence, to generate N CRC fields and to combine N−1 CRC fields respectively with the N−1 CBs, such that each of the N−1 CRC fields undergoing combination with a respective one of the N−1 CBs, and to combine one of the N CRC fields with the modified CB to generate N CRC CBs; and
    an output to output the N CRC CBs.

2. The apparatus of claim 1, wherein the sequence corresponding to at least one transport block (TB).

3. The apparatus of claim 1, further comprising:
    a turbo encoder to encode a plurality of information bits to generate the N CBs;
    and wherein:
    the N CBs are N turbo code blocks.

4. The apparatus of claim 1, further comprising:
    an LDPC (Low Density Parity Check) encoder to encode a plurality of information bits to generate the N CBs; and wherein:
    the N CBs are N LDPC code blocks.

5. The apparatus of claim 1, wherein the apparatus being a communication device operative within at least one of a satellite communication system, a wireless communication system, a wired communication system, and a fiber-optic communication system.

6. An apparatus comprising:
    an input to receive a sequence including N coded blocks (CBs) that includes a first CB, a second CB, and a last CB, where N is an integer;
    a first cyclic redundancy check (CRC) encoder to process all of the N CBs to generate a first CRC field and to combine the first CRC field with the second CB to generate a modified CB and to generate a modified sequence including N−1 CBs and the modified CB;
    a second CRC encoder to process each of the N−1 CBs and the modified CB, of the modified sequence, to generate N CRC fields and to combine N−1 CRC fields respectively with the N−1 CBs, such that each of the N−1 CRC fields undergoing combination with a respective one of the N−1 CBs, and to combine one of the N CRC fields with the modified CB to generate N CRC CBs; and
    an output to output the N CRC CBs.

7. The apparatus of claim 6, wherein the sequence including N CBs including a first CB, a last CB, and a plurality of CBs interposed between the first CB and the last CB.

8. The apparatus of claim 6, wherein a low density parity check (LDPC) encoder to encode a plurality of information bits to generate the N CBs, which are N LDPC code blocks.

9. The apparatus of claim 6, wherein the sequence corresponding to at least one transport block (TB).

10. The apparatus of claim 6, further comprising:
    a turbo encoder to encode a plurality of information bits to generate the N CBs;
    and wherein:
    the N CBs are N turbo code blocks.

11. The apparatus of claim 6, wherein the first CRC encoder to employ a first generation polynomial to generate the first CRC field; and
    the second CRC encoder to employ a second generation polynomial to generate the N CRC fields.

12. The apparatus of claim 6, further comprising:
    the first CRC encoder to employ a generation polynomial to generate the first CRC field; and
    the second CRC encoder to employ the generation polynomial to generate the N CRC fields.

13. The apparatus of claim 6, wherein the apparatus being a communication device operative within at least one of a satellite communication system, a wireless communication system, a wired communication system, and a fiber-optic communication system.

14. A method execution by a communication device, the method comprising:
    via an input, receiving a sequence including N coded blocks (CBs) that includes a first CB, a second CB, and a last CB, where N is an integer;
    performing first cyclic redundancy check (CRC) encoding to process all of the N CBs to generate a first CRC field and to combine the first CRC field with the second CB to generate a modified CB and to generate a modified sequence including N−1 CBs and the modified CB;
    performing second CRC encoding to process each of the N−1 CBs and the modified CB, of the modified sequence, to generate N CRC fields and to combine N−1 CRC fields respectively with the N−1 CBs, such that each of the N−1 CRC fields undergoing combination with a respective one of the N−1 CBs, and to combine one of the N CRC fields with the modified CB to generate N CRC CBs; and
    via an input, outputting the N CRC CBs.

15. The method of claim 14, wherein the sequence including N CBs including a first CB, a last CB, and a plurality of CBs interposed between the first CB and the last CB; and
    the one of the N CBs undergoing combination with the first CRC field to generate a modified CB is one of the plurality of CBs.

16. The method of claim 14, further comprising:
    performing turbo encoding to encode a plurality of information bits to generate the N CBs, which are N turbo code blocks.

17. The method of claim 14, wherein the sequence corresponding to at least one transport block (TB).

18. The method of claim 14, wherein the first CRC encoding to employ a first generation polynomial to generate the first CRC field; and
    the second CRC encoding to employ a second generation polynomial to generate the N CRC fields.

19. The method of claim 14, wherein the first CRC encoding to employ a generation polynomial to generate the first CRC field; and
    the second CRC encoding to employ the generation polynomial to generate the N CRC fields.

20. The method of claim 14, wherein the communication device operative within at least one of a satellite communication system, a wireless communication system, a wired communication system, and a fiber-optic communication system.

\* \* \* \* \*

UNITED STATES PATENT AND TRADEMARK OFFICE
CERTIFICATE OF CORRECTION

PATENT NO. : 8,640,011 B2  
APPLICATION NO. : 13/559788  
DATED : January 28, 2014  
INVENTOR(S) : Ba-Zhong Shen et al.

Page 1 of 1

It is certified that error appears in the above-identified patent and that said Letters Patent is hereby corrected as shown below:

In the Claims

Col. 18, line 27, in claim 14: After "A method" insert --for--  
Col. 18, line 45, in claim 14: Replace "via an input" with --via an output--

Signed and Sealed this  
Thirtieth Day of September, 2014

Michelle K. Lee  
*Deputy Director of the United States Patent and Trademark Office*